United States Patent [19]

Shiragasawa

[11] Patent Number: 4,541,090
[45] Date of Patent: Sep. 10, 1985

[54] SEMICONDUCTOR MEMORY DEVICE

[75] Inventor: Tsuyoshi Shiragasawa, Neyagawa, Japan

[73] Assignee: Matsushita Electric Industrial Co., Ltd., Kadomi, Japan

[21] Appl. No.: 383,838

[22] Filed: Jun. 1, 1982

[30] Foreign Application Priority Data

Jun. 9, 1981 [JP] Japan .................................. 56-88385
Jun. 16, 1981 [JP] Japan .................................. 56-93339

[51] Int. Cl.³ .............................................. G11C 13/00
[52] U.S. Cl. ..................................... 371/21; 365/201
[58] Field of Search ............................. 371/19, 21, 24; 365/189, 233, 201, 207, 210, 230

[56] References Cited

U.S. PATENT DOCUMENTS 4,317,200  2/1982  Wakatsuki et al. .................. 371/21

Primary Examiner—Terrell W. Fears
Attorney, Agent, or Firm—Cushman, Darby & Cushman

[57] ABSTRACT

A large capacity memory is improved so as to reduce its testing time length. Memory arrays are divided into a plural number of memory blocks having common address signal lines and common input/output lines, each memory block is provided with respective comparators thereby enabling testings of the plural number of memory blocks parallelly at the same time.

6 Claims, 5 Drawing Figures

SEMICONDUCTOR MEMORY DEVICE

BACKGROUND OF THE INVENTION

1. Field of the Invention:

The present invention relates in general to semiconductor memory devices, especially those having a very large memory capacity. More specifically, the invention is directed to shortening the testing time of a semiconductor memory device.

2. Prior Art:

FIG. 1 (Prior Art) shows a schematical block diagram of an exemplary conventional semiconductor memory device of a fairly large memory capacity, for instance, a 64 K bits random access memory (RAM). Address signals provided via signal lines A0, A1 . . . A7 and signal lines A8, A9 . . . A15 are decoded by the X-decoder 1 and Y-decoder 2 and select a single memory cell in the memory array 3. In a writing cycle, the input data provided through the input/output terminal 4 is controlled by an input/output circuit 5 and is memorized in the selected memory cell. In a reading cycle, the data or information of the selected memory cell is amplified and controlled by the input/output circuit 5 and provided as an output through the terminal 4.

In a testing procedure of a RAM, writings and readings of data into and out of the memory array are carried out, and the read-data are checked, that is the data are compared with expected data. In order to test a large memory, a single writing and reading is not sufficient, because data destruction due to interference of proximity cells or as a result of some addressing way may take place in the RAM. Therefore, testing of as many combinations of data and as many combinations of addressing as possible are necessary. Most general testing methods known for such purpose are "Walking", "Pingpong" and "Gallopping". The testing called "Gallopping" is performed as follows. One memory all of the array is selected and caused to assume a "0" state. All other cells are "1" Data of the appointed cell and of all the rest of the cells are read out alternatingly, and the appointed cell is change to another cell and the process is repeated. The change of appointed memory cell proceeds one after another and this testing requires $6N^2+6N$ cycles of writing and reading for a memory of N bits.

When the "Gallopping" testing is made for the conventional RAM, as can be understood from the above formula, the testing time length becomes extraordinarily long as memory capacity becomes large. For instance, when cycle time is 100 NS, the testing time lengths are:

for 4 K bits memory . . . substantially 10 seconds,
16 K bits memory . . . substantially 2 minutes 41 seconds,
64 K bits memory . . . substantially 42 minutes 57 seconds and,
256 K bits memory . . . substantially 11 hours 2 minutes 9 seconds.

By constituting the RAM as 8 blocks construction, the testing time can be shortened to one eighth of the above time length, the time length is still very long.

SUMMARY OF THE INVENTION

The present invention solves the problem of long testing time length. That is, according to the present invention, the testing time can be drastically shortened for a large capacity memory. The memory device in accordance with the present invention can be formed as an integrated circuit on a monolithic semiconductor substrate. The objective of the invention is to easily detect a defective memory cell of a semiconductor memory device and to provide a usable semiconductor memory using only the non-defective cells to obtain a higher production yield than is possible by conventional design.

The semiconductor memory device in accordance with the present invention comprises:
- a plural number of memory array blocks having common address signal lines and common input/output lines and
- the same plural number of comparators for comparing respective output signals of said memory array blocks and common respective expected signals for testing therewith.

DESCRIPTION OF THE PREFERRED EMBODIMENT

Figure 1:
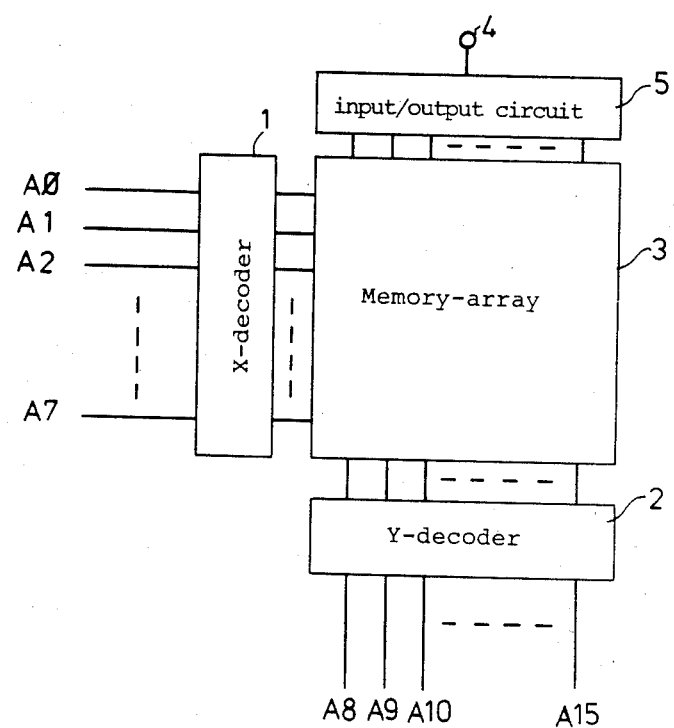
FIG. 1 (Prior Art) is the circuit block diagram of the exemplary conventional semiconductor memory device of a fairly large memory capacity.
Figure 2:
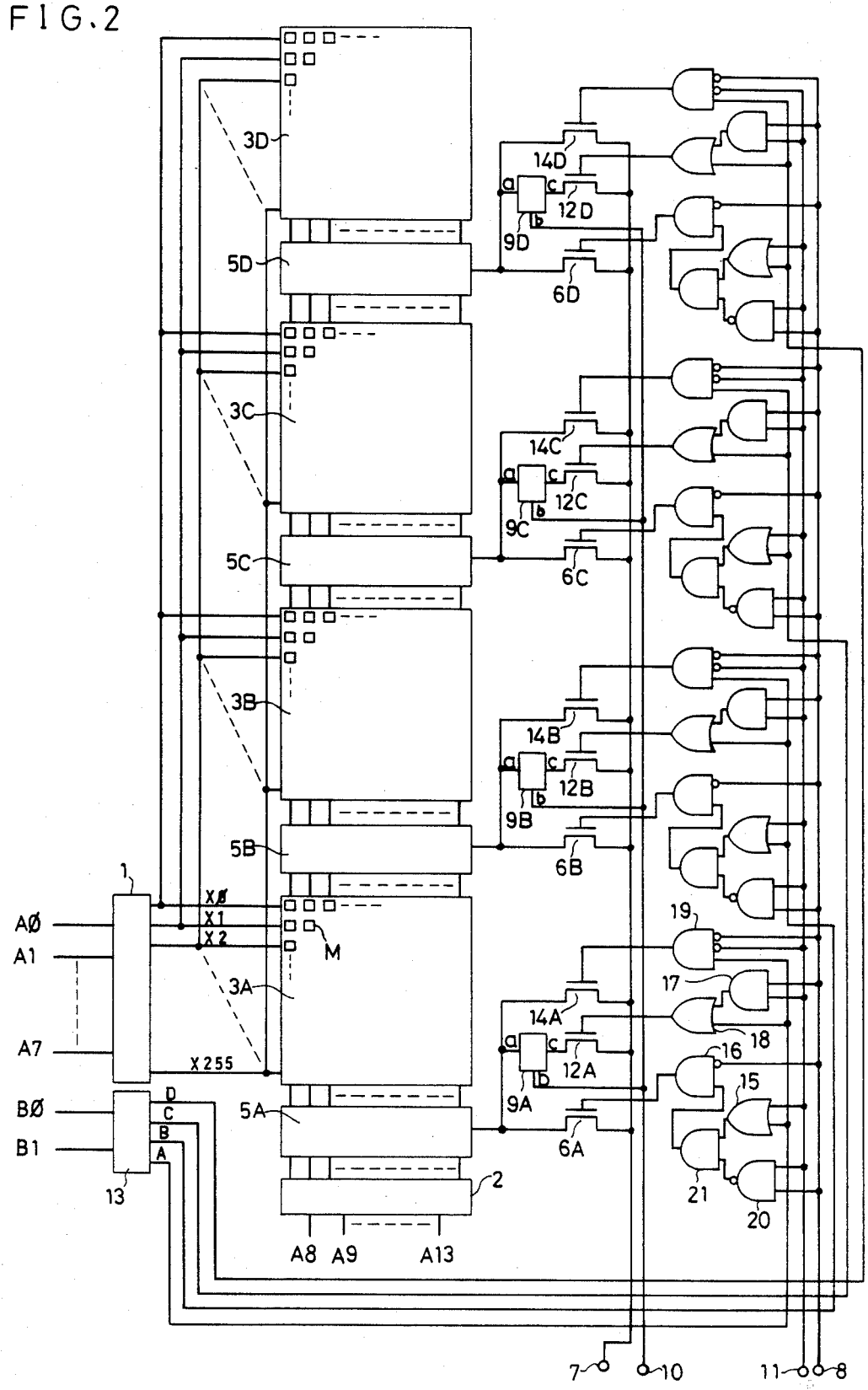
FIG. 2 is a circuit block diagram of a semiconductor memory embodying the present invention.

FIG. 2 shows a semiconductor memory device embodying the present invention, that is a semiconductor RAM having a memory capacity of 64 K (65,536) bits, where the memory arrays are divided into four blocks 3A, 3B, 3C and 3D, each being of 16 K (16,384) bits. If the RAM is constituted as 8 blocks of 8 K (first occurrence 8192) (second occurrence 8192) bits memory arrays, then each 8 K bits array is to be divided into four blocks of 2 K (2048) bits arrays. The dividing number four is only an exemplary one, and any integer number may be used. As is known, each memory cell M in the memory array block is formed by six elements when the RAM is a static RAM, or by two elements when the RAM is a dynamic RAM. The memory arrays and related input/output circuits, control circuit and testing circuit are formed integrally on a monolithic integral circuit.

Figure 3:
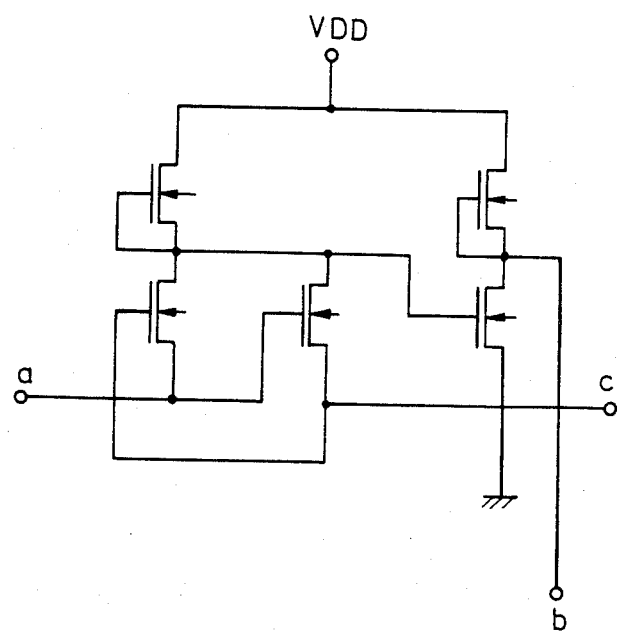
FIG. 3 is a circuit diagram showing an exemplary circuit of comparators of FIG. 2.

The address signals from the lines A0 to A7 are decoded by an X-decoder 1 to produce X-address signals X0, X1, . . . X255, which are fed to the memory array blocks 3A, 3B, 3C and 3D. The address signals from the lines A8 to A13 are decoded by a Y-decoder 2 to produce Y-address signals Y0, Y1, . . . Y64, which are fed to the memory array blocks 3A, 3B, 3C and 3D. As a result, one memory cell is selected in each memory array block. The memory array blocks 3A, 3B, 3C and 3D comprise input/output circuits 5A, 5B, 5C and 5D, respectively. The input/output circuits 5A, 5B, 5C and 5D are connected to a data line 7, through block selection switches 6A, 6B, 6C and 6D, respectively. Comparators 9A, 9B, 9C and 9D are connected by their terminals "a" to the input/output circuits 5A, 5B, 5C and 5D, by their terminals "b" to the external checking terminal 10, and by their terminals "c" to comparator selection switches 12A, 12B, 12C and 12D, which are connected to the data line 7 by their other ends, respectively. The comparators 9A, 9B, 9C and 9D are constructed by exclusive OR gates as shown by FIG. 3, wherein the terminals "a", "b" and "c" correspond with the same reference characters as in FIG. 2 and VDD designates source voltage impressing terminal. Numerals 14A, 14B, 14C and 14D designate reading switches connected between the input/output circuits 5A, 5B, 5C and 5D and the data line 7, respectively. Numeral 13 designates a block decoder. The block selection switches 6A, 6B, 6C and 6D are controlled by logical product of (i) a logical summation of testing signal given from testing terminal 11 and block selection signals from the block decoder 13, and (ii) writing signal given from the read/write terminal 8. The control is done by logic circuits of OR gate 15, AND gate 16, AND gate 17, OR gate 18, AND gate 19, NAND gate 20 and AND gate 21. The same sets of logic circuits are provided for respective memory array blocks 3A, 3B, 3C and 3D. All the circuits of FIG. 2 are formed integrally as an IC on a semiconductor monolithic substrate.

The operations of the circuit of FIG. 2 is elucidated hereafter:

[Testing]

Testing of the RAM of FIG. 2 embodying the present invention is as follows: A High (H) level testing signal is impressed on the testing terminal 11.

In the "writing cycle", all the block selection switches 6A, 6B, 6C and 6D are closed (turned on) by the testing signals and the writing signals. Therefore, data on the data line 7 is coupled to one memory cell which is selected by each X decoder 1 and Y decoder 2 of the memory array blocks 3A, 3B, 3C and 3D through the block selection switches 6A, 6B, 6C and 6D and the input/output circuits 5A, 5B, 5C and 5D, and written in the memory, respectively. In this stage, the comparators 9A, 9B, 9C and 9D are in their resting states.

Then in the "reading cycle", the stored information in the cells memory of memory array blocks 3A, 3B, 3C and 3D are read out by the input/output circuit 5A, 5B, 5C and 5D. Then, by means of the logical products of reading signal (high level) given through the read/write (R/W) terminal 8, and by means of logical summation of the block selection signal and the logical product, the comparator selection switches 12A, 12B, 12C and 12D are closed, and the respective comparators perform their functions. These are made by AND gate 17, and output signals from the input/output circuits 5A, 5B, 5C and 5D are compared with the expected data on the data line 7.

Now, provided that a selected memory cell in the memory array 3A has a defect, then the output signal from the input/output circuit 5A is different from the expected data on the data line 7, and therefore a fail signal is issued from the comparator 9A, and a defect signal is issued to the check terminal 10. When all the memory array blocks issue the same output signals to the expected data, then no fail signal is issued to the check terminal 10. The actual circuit is constituted, for instance, so as to issue output signal "1" when either comparator issue output signal "1", and such constitution is made by for example using OR circuit between output circuit of the comparators 9A, 9B, 9C and 9D and the terminal 10.

As has been elucidated, for the testing of the RAM, the readings and writings are made simultaneously for a plural number of memory array blocks, and when some defects exist in some memory array blocks a comparator attached to such memory array block issues fail signal through the checking terminal 10, thus indicating defect of the RAM.

[Ordinary RAM working]

When the RAM has been tested in the above-mentioned way and passed as good, then the RAM is used as follows:

The testing terminal 11 is retained at "L" level, and block selection signals are given to the selection terminals B0 and B1 of the block decoder 13 for selecting the memory block wherein reading or writing are going to be made. Either one memory array block is selected by the block selection signal given to the block decoder 13. In the example of FIG. 2, the block selection terminals are provided separately from the address input terminal. However, in a modified example, some one of the address input can be used as the block selection signal, and thereby the RAM can be used quite similarly as ordinary RAM without such memory array blocks construction.

"Writing cycle" in the ordinary operation is as follows:

Data to be written into the memory is impressed on the data line 7, and the data is about to be given to the input/output circuit 5A, 5B, 5C and 5D through the block selection switch 6A, 6B, 6C and 6D. Hereupon, since the testing signal is always "L" level, the block selection switches 6A, 6B, 6C and 6D are controlled by the logical product of the block selection signal and the writing signal. Therefore, either selected switch 6A, 6B, 6C or 6D becomes ON and writing is made into a selected particular memory array block.

"Reading Cycle" in the ordinary operation is as follows:

In this cycle, the selection switches 6A, 6B, 6C and 6D and comparator selection switches 12A, 12B, 12C and 12D are all opened (off), and accordingly, data of the selected memory array block only are put out to the data line 7 through the reading switch 14A, 14B, 14C and 14D, which are controlled by AND gates 19. Thus, the data on the data line 7 are read out through known output buffer circuit (not shown) to the external output terminal.

As has been elucidated, the RAM in accordance with the present invention can be used similarly to the ordinary conventional RAM.

Figure 4:
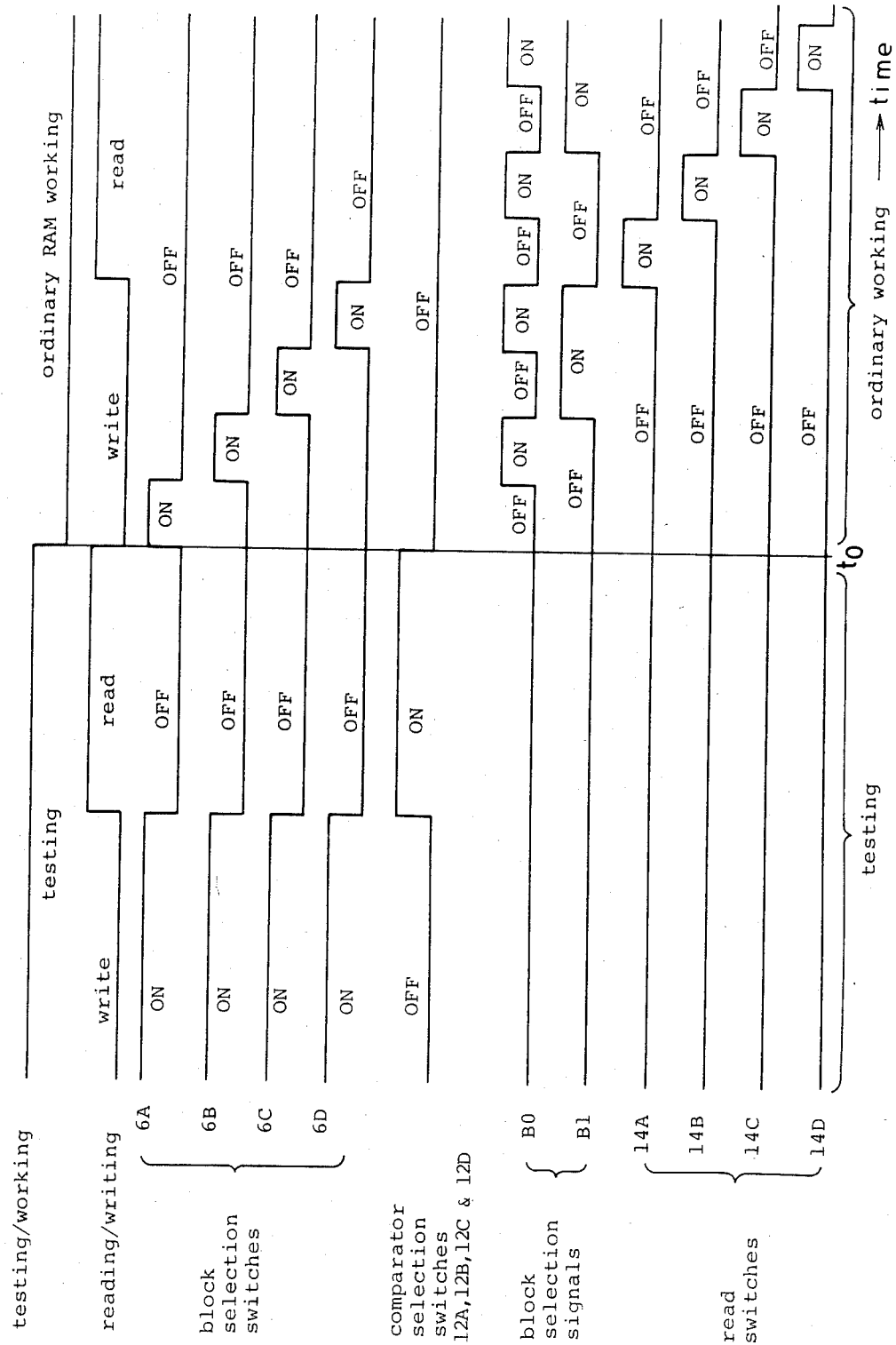
FIG. 4 is a time chart elucidating operation of the circuit of FIG. 2.

FIG. 4 is a timing chart showing operations during the testing and ordinary working of the RAM of FIG. 2. In FIG. 4, left side of the vertical line $t_0$ shows testing, and right side of the vertical line $t_0$ shows ordinary working of the RAM. The curves show testing/working, reading/writing, block selection switches (6A, 6B, 6C . . . ), comparator selection switches (12A, 12B . . . ), block selection signals (B0, B1), and read switches (14A, 14B . . . ), respectively from the top to the bottom.

The construction in accordance with the present invention shown in FIG. 2 enables parallel or simultaneous testing of several memory array blocks of a RAM, and therefore, time length for the testing of the RAM can be drastically minimized by this block configuration. For example, for the same 64 K bit RAM of the conventional art and of the present invention are compared, for the Galloping testing at cycle time of 100 NS, the conventional RAM requires about 42 minutes 57 seconds, while the present invention RAM requires only about 2 minutes 41 seconds. It is to be understood that the number of dividing into blocks is larger, the testing time becomes shorter. This invention is applicable in the same manner both for the static RAM and dynamic RAM.

Figure 5:
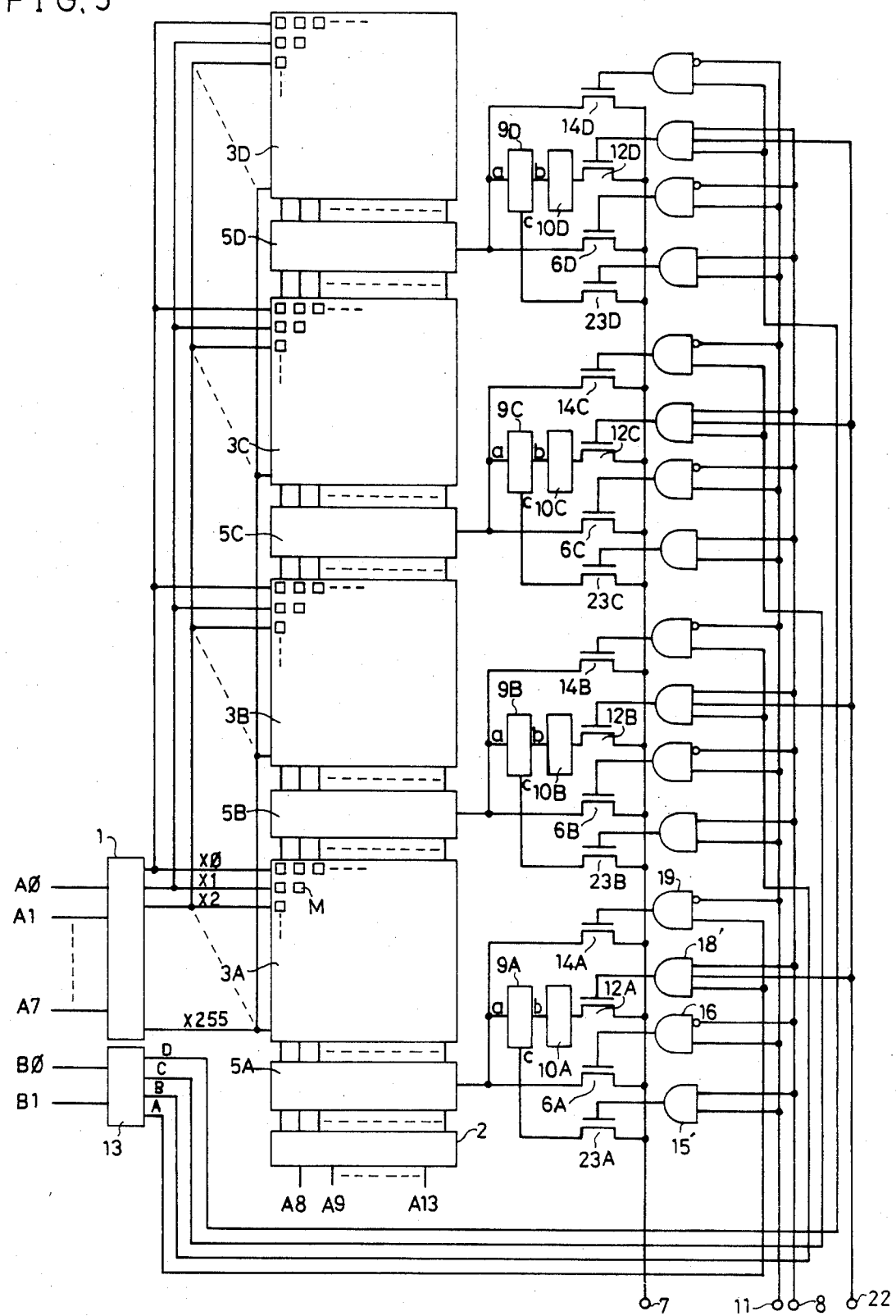
FIG. 5 is a circuit block diagram of another semiconductor memory embodying the present invention.

FIG. 5 shows a second example of semiconductor memory device embodying the present invention, that is another semiconductor RAM having a memory capacity of 64 K bits, where in the same way as the example of FIG. 2 the memory arrays are divided into four blocks 3A, 3B, 3C and 3D, each being of 16 K bits. The components corresponding to those of the example of FIG. 2 are designated by the same numerals and marks thereto. If the RAM is constituted as 8 blocks of 8 K bits memory arrays, then each 8 K bits array is to be divided into four blocks of 2 K bits arrays. The dividing number four is only an exemplary one, and any integer number may be used. As is known, each memory cell M in the memory array block is formed by six elements when the RAM is a static RAM, or by two elements when the RAM is a dynamic RAM. The memory arrays and related input/output circuits, control circuit and testing circuit are formed integrally on a monolithic integral circuit.

The address signals from the lines A0 to A7 are decoded by an X-decoder 1 to produce X-address signals X0, X1 ... X255, which are fed to the memory array blocks 3A, 3B, 3C and 3D. The address signals from the lines A8 to A13 are decoded by a Y-decoder 2 to produce Y-address signals Y0, Y1 ... Y63, which are fed to the memory array blocks 3A, 3B, 3C and 3D. As a result, one memory cell is selected in each memory array block. The memory array blocks 3A, 3B, 3C and 3D comprise input/output circuits 5A, 5B, 5C and 5D, respectively. The input/output circuits 5A, 5B, 5C and 5D are connected to a data line 7, through block selection switches 6A, 6B, 6C and 6D, respectively. Comparators 9A, 9B, 9C and 9D are connected by their terminals "a" to the input/output circuits 5A, 5B, 5C and 5D, by their terminals "b" to known fail registers 10A, 10B, 10C and 10D, and by their terminals "c" to comparator enabling switches 23A, 23B, 23C and 24D, which are connected to the data line 7 by their other ends, respectively. The comparators 9A, 9B, 9C and 9D are constructed by exclusive OR gates as shown by FIG. 3, wherein the terminals "a", "b" and "c" correspond with the same marks in FIG. 5 and VDD designates source voltage impressing terminal. The fail registers may be constituted with ordinary flipflops. Numerals 14A, 14B, 14C and 14D designate reading switches connected between the input/output circuits 5A, 5B, 5C and 5D and the data line 7, respectively. Numeral 13 designates a block decoder. The block selection switches 6A, 6B, 6C and 6D are controlled by logical product of testing signal given from testing terminal 11 and writing signal given from the read/write terminal 8. The control is done by logic circuits of AND gate 15', AND gate 16, AND gate 18' and AND gate 19. The same sets of logic circuits are provided for respective memory array blocks 3A, 3B, 3C and 3D. All the circuits of FIG. 5 are formed integrally as an IC on a semiconductor monolithic substrate.

The operations of the second example circuit of FIG. 5 is elucidated hereafter:

[Testing]

Testing of the RAM of FIG. 5 embodying the present invention is as follows: An "H" level testing signal is impressed on the testing terminal 11.

In the "writing cycle", all the block selection switches 6A, 6B, 6C and 6D are closed by the testing signals and the writing signals. Therefore, data on the data line 7 is given to the memory array blocks 3A, 3B, 3C and 3D through the block selection switches 6A, 6B, 6C and 6D and the input/output circuits 5A, 5B, 5C and 5D, and written in the memory, respectively. In this state, the comparators 9A, 9B, 9C and 9D as well as fail registers 10A, 10B, 10C and 10D are in their resting states.

Then in the "reading cycle", the stored information in the cells of memory array blocks 3A, 3B, 3C and 3D are read out by the input/output circuit 5A, 5B, 5C and 5D. Then, the comparator enabling switches 23A, 23B, 23C and 23D are closed being controlled by means of the logical products of reading signal given through the R/W terminal 8 and the testing signal, thereby the comparators 9A, 9B, 9C and 9D and the fail registers 10A, 10B, 10C and 10D perform their functions. These are made by AND gate 15', and output signals from the input/output circuits 5A, 5B, 5C and 5D are compared with the expected data on the data line 7.

Now, provided that a memory cell in the memory array 3A has a defect, then the output signal from the input/output circuit 5A is different from the expected data on the data line 7, and therefore a fail signal is issued from the comparator 9A, and a fail signal is set in the fail register 10A. Provided that output signals of other memory array blocks agree with the expected data thereof, there are no fail signals set in the other fail registers 10B, 10C and 10D. The actual circuit is constituted, for instance, in a manner that, in a testing of the RAM, the readings and writings are simultaneously done in the plural number of memory array blocks, and when a defect memory cell exists in a memory array block, a fail signal is set in the memory array block containing the defect cell. Then, by reading the fails signal of the fail registers after finishing the testing, the good or no-good of the RAM or any block therein can be detected. The data of the fail register 10A, 10B, 10C and 10D can be read out through the register reading switch 12A, 12B, 12C, 12D, which are controlled by a logical products of register reading signal and read/write signal at the register reading terminal 22, testing signal and block selection signal and read/write signal.

As has been elucidated, similarly to the example of FIG. 2, for the testing of the RAM, the readings and writings are made simultaneously for a plural number of memory array blocks, and therefore the testing speed is very high. And moreover, by means of the function of detecting a particular block containing defect memory cell(s), it becomes feasible to use the memory array blocks containing some fefect cells as a smaller capacity memory by disabling the defect block(s). Thus, increase of production yield or decrease of memory cost as a general is attainable.

The "ordinary working" of the RAM of FIG. 5 is substantially the same as that of the first example of FIG. 2.

As a conclusion, the memory device in accordance with the present invention comprises a plural number of memory array blocks having data input/output line and address signal lines in common, each memory array block is provided with comparator, thereby enabling simultaneous testings made parallelly for the plural memory array blocks, and also enabling detection of defect block. Accordingly, the present invention is very much advantageous in speeding up of the testing of the large memory device and in improving manufacturing yield or decrease of cost of the memory device as a whole.

What is claimed is:

1. A semiconductor memory device including a testing arrangement therein and adapted such that parts thereof tested as defective can be disabled, allowing those parts tested non-defective to be used, comprising:
   a plural number of memory array blocks having common address signal lines and common input/output lines,
   means for inputting predetermined data to predetermined addresses of said blocks:
   means for reading data previous input to said blocks as output data;
   a comparator associated with each block for said input and output data and providing a pass or fail signal indicative of an identity or non-identity, respectively therebetween and
   means for disabling any blocks for which a fail signal was provided by its associated comparator.

2. A semiconductor memory device in accordance with claim 1, further comprising:
   fail registers connected to respective comparators for storing respective fail signals which can be selectively read as part of a testing procedure.

3. A semiconductor memory device in accordance with claim 1, wherein said memory array blocks are random access memories.

4. A semiconductor memory device in accordance with claim 1, which further comprises;
   a control circuit for controlling input data to said blocks operation of said comparator circuit to compare said input and output data.

5. A semiconductor memory device in accordance with claim 1, wherein a specified memory array block is selected among the plural memory array blocks by a block selection signal.

6. A semiconductor memory device in accordance with claim 1, wherein said memory array blocks and said respective comparators are formed integrally on a monolithic semiconductor substrate.

* * * * *